(12) United States Patent
Chen et al.

(10) Patent No.: US 6,765,277 B2
(45) Date of Patent: Jul. 20, 2004

(54) MICROELECTRONIC FABRICATION WITH CORROSION INHIBITED BOND PAD

(75) Inventors: Yen-Ming Chen, Hsin-Chu (TW); Chia-Fu Lin, Hsin-Chu (TW); Yang-Tung Fan, Juebi (TW); Hong-Wen Huang, Hsin-Chu (TW); Cheng-Yu Chu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/050,300

(22) Filed: Jan. 15, 2002

(65) Prior Publication Data

US 2003/0132497 A1 Jul. 17, 2003

(51) Int. Cl.[7] .............................................. H01L 31/00
(52) U.S. Cl. ........................ 257/459; 257/763; 257/764; 257/737; 257/685; 257/700; 438/597; 438/612; 438/614
(58) Field of Search ................................ 438/614, 622, 438/637, 640, 612, 597; 257/253, 254, 693, 700, 786, 737, 763, 764

(56) References Cited

U.S. PATENT DOCUMENTS

| 6,130,479 A | 10/2000 | Chalco et al. |
| 6,214,717 B1 | 4/2001 | Lan et al. |
| 6,555,460 B2 * | 4/2003 | Farnworth .................. 438/614 |

* cited by examiner

*Primary Examiner*—David Nelms
*Assistant Examiner*—Mai-Huong Tran
(74) *Attorney, Agent, or Firm*—Tung & Associates

(57) ABSTRACT

Within a method for fabricating a microelectronic, and a microelectronic fabrication fabricated in accord with the method, there is formed upon a bond pad formed over a substrate a conductor passivation layer. Within the method and the microelectronic fabrication, the bond pad is formed from a conductor material selected from the group consisting of aluminum and aluminum alloy conductor materials, and the conductor passivation layer is formed from a noble metal conductor material. The invention provides particular value for fabricating color filter sensor image array optoelectronic microelectronic fabrications with attenuated bond pad corrosion.

10 Claims, 2 Drawing Sheets

MICROELECTRONIC FABRICATION WITH CORROSION INHIBITED BOND PAD

BACKGROUND OF THE INVENTION

1. Field of the Invention

The present invention relates generally to microelectronic fabrications. More particularly, the present invention relates to bond pad corrosion inhibited microelectronic fabrications.

2. Description of the Related Art

Microelectronic fabrications are formed microelectronic substrates over which are formed patterned microelectronic conductor layers which are separated by microelectronic dielectric layers.

Within the general art of microelectronic fabrication, there exist purely electronic microelectronic fabrications whose operation is based solely upon electrical signal storage and processing characteristics of purely electronic microelectronic devices and microelectronic circuits formed upon a microelectronic substrate. Examples of such purely electronic microelectronic fabrications typically include, but are not limited to, semiconductor integrated circuit microelectronic fabrications and ceramic substrate microelectronic fabrications. Similarly, there also exist within the general art of microelectronic fabrication microelectronic fabrications whose operation is based upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications; and (2) image array optoelectronic microelectronic fabrications such as but not limited to: (a) sensor image array optoelectronic microelectronic fabrications; and (b) display image array optoelectronic microelectronic fabrications.

Common to all microelectronic fabrications, whether purely electronic microelectronic fabrications or optoelectronic microelectronic fabrications, is the use of bond pads as a means for connecting and interconnecting the microelectronic fabrications into useful microelectronic products.

While the use of bond pads for connecting and interconnecting microelectronic fabrications, including but not limited to purely electronic microelectronic fabrications and optoelectronic microelectronic fabrications, into useful microelectronic products is quite common in the art of microelectronic fabrication, the use of bond pads when connecting and interconnecting microelectronic fabrications, including but not limited to purely electronic microelectronic fabrications and optoelectronic microelectronic fabrications, into useful microelectronic products is not entirely without problems in the art of microelectronic fabrication.

In that regard, incident to exposure to various microelectronic fabrication processes there is often corroded, eroded, stained or otherwise degraded bond pads which are employed within microelectronic fabrications. Although various mechanisms may provide such corroded, eroded, stained or otherwise degraded bond pads, within the context of the present invention the terminology "corrosion" or "corroded" is intended to include physical and/or electrical performance degradation of a bond pad employed within a microelectronic fabrication, irrespective of the actual mechanism through which such physical or electrical performance degradation actually occurs. Use of corroded bond pads is undesirable in the art of microelectronic fabrication since it is often difficult to form fully functional or reliable electrical connections within a microelectronic fabrication when employing a corroded bond pad.

It is thus towards the goal of providing within the art of microelectronic fabrication methods and materials for forming within microelectronic fabrications bond pads with attenuated corrosion that the present invention is most generally directed. More particularly, it is also towards the goal of providing within the art of optoelectronic microelectronic fabrication methods and materials for forming within optoelectronic microelectronic fabrication bond pads with attenuated corrosion that the present invention is more specifically directed.

Various methods and materials have been disclosed in the art of microelectronic fabrication for forming within microelectronic fabrications bond pads with desirable properties.

Included among the methods and materials, but not limited among the methods and materials, are methods and materials disclosed within: (1) Chalco et al., in U.S. Pat. No. 6,130,479 (a method for forming within a solder joint connected to a bond pad a comparatively thin intermetallic layer, by forming over the bond pad a nickel layer having formed thereupon a noble metal (preferably gold) layer and thermally annealing the same to form a nickel-noble metal alloy layer, prior to forming and thermally annealing over the nickel-noble metal alloy layer a tin containing solder layer); and (2) Lan et al., in U.S. Pat. No. 6,214,717 (a method for inhibiting bond pad staining and enhancing bond pad bondability, particularly within an optoelectronic microelectronic fabrication, by treating an aluminum-silicon-copper alloy bond pad with a fluorine containing plasma prior to bonding thereto a bond wire).

Desirable in the art of microelectronic fabrication are additional methods and materials which may be employed for attenuating within a microelectronic fabrication corrosion of a bond pad formed within the microelectronic fabrication. More particularly desirable in the art of optoelectronic microelectronic fabrication are additional methods and materials which may be employed for attenuating within an optoelectronic microelectronic fabrication corrosion of a bond pad formed within the optoelectronic microelectronic fabrication.

It is towards the foregoing objects that the present invention is both generally and more specifically directed.

SUMMARY OF THE INVENTION

A first object of the invention is to provide a method for attenuating within a microelectronic fabrication corrosion of a bond pad formed within the microelectronic fabrication.

A second object of the present invention is to provide a method in accord with the first object of the present invention, where the microelectronic fabrication is an optoelectronic microelectronic fabrication.

A third object of the present invention is to provide a method in accord with the first object of the present invention and the second object of the present invention, wherein the method is readily commercially implemented.

In accord with the objects of the present invention, there is provided by the present invention a microelectronic fabrication and a method for fabricating the microelectronic fabrication.

To practice the method of the present invention, there is first provided a substrate. There is then formed over the substrate a bond pad formed of a conductor material selected from the group consisting of aluminum and aluminum alloy conductor materials. There is then formed upon the bond pad a conductor passivation layer formed of a noble metal conductor material. Preferably the noble metal conductor material is selected from the group consisting of gold and gold alloy conductor materials.

The method for fabricating the microelectronic fabrication in accord with the present invention contemplates a microelectronic fabrication fabricated in accord with the method for fabricating the microelectronic fabrication in accord with the present invention.

Similarly, both the method for fabricating the microelectronic fabrication in accord with the present invention and the microelectronic fabrication fabricated in accord with the method for fabricating the microelectronic fabrication in accord with the present invention provide particular value within the context of fabricating image array optoelectronic microelectronic fabrications, and in particular color filter sensor image array optoelectronic microelectronic fabrications.

The present invention provides a method for attenuating within a microelectronic fabrication corrosion of a bond pad formed within the microelectronic fabrication, where the microelectronic fabrication may be, and preferably is, an optoelectronic microelectronic fabrication.

The present invention realizes the foregoing object by employing when forming the microelectronic fabrication, and formed upon a bond pad formed of an aluminum or aluminum alloy conductor material formed over a substrate employed within the microelectronic fabrication, a conductor passivation layer formed of a noble metal conductor material, preferably selected from the group consisting of gold and gold alloy conductor materials.

The method of the present invention is readily commercially implemented.

The present invention employs methods and materials as are otherwise generally conventional in the art of microelectronic fabrication, but employed within the context of specific materials selections and specific process limitations to provide the present invention. Since it is thus at least in part a series of materials selections and process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for attenuating within a microelectronic fabrication corrosion of a bond pad formed within the microelectronic fabrication, where the microelectronic fabrication may be, and preferably is, an optoelectronic microelectronic fabrication.

The present invention realizes the foregoing object by employing when forming the microelectronic fabrication, and formed upon a bond pad formed of an aluminum or aluminum alloy conductor material formed over a substrate employed within the microelectronic fabrication, a conductor passivation layer formed of a noble metal conductor material, preferably selected from the group consisting of gold and gold alloy conductor materials.

Although the preferred embodiment of the present invention illustrates the present invention within the context of forming a color filter sensor image array optoelectronic microelectronic fabrication, the present invention may be employed for forming with, attenuated bond pad corrosion, microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 5, there is shown a series of schematic cross-sectional diagrams illustrating the results of progressive stages in forming, in accord with a preferred embodiment of the present invention, a color filter sensor image array optoelectronic microelectronic fabrication.

Figure 1:
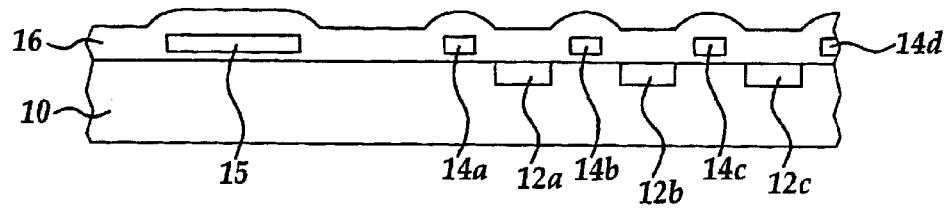
FIG. 1, FIG. 2, FIG. 3, FIG. 4 and FIG. 5 show a series of schematic cross-sectional diagrams illustrating the results of progressive stages in forming, in accord with a preferred embodiment of the present invention, a color filter sensor image array optoelectronic microelectronic fabrication.

Shown in FIG. 1 is a schematic cross-sectional diagram of the color filter sensor image array optoelectronic microelectronic fabrication at an earlier stage in its fabrication in accord with the preferred embodiment of the present invention.

Shown in FIG. 1, in a first instance, is a substrate 10 having formed therein a series of photoactive regions 12a, 12b and 12c. As is further illustrated within the schematic cross-sectional diagram of FIG. 1, the substrate 10 is further divided into an active region R1 having formed therein the photoactive regions 12a, 12b and 12c, and a peripheral region R2 not having formed therein the photoactive regions 12a, 12b and 12c.

Within the preferred embodiment of the present invention with respect to the substrate 10 and the series of photoactive regions 12a, 12b and 12c, the substrate 10 is typically and preferably a silicon semiconductor substrate, and the series of photoactive regions 12a, 12b and 12c is typically and preferably a series of photodiode regions within the silicon semiconductor substrate. However, the present invention may provide value with respect to an optoelectronic microelectronic fabrication which employs a substrate other than a silicon semiconductor substrate, where the substrate has formed therein, thereupon or thereover photoactive regions formed of other than photodiodes. Typically and preferably, the silicon semiconductor substrate will have an N− or P− doping concentration, while the photodiode photoactive regions 12a, 12b and 12c will typically and preferably have a complementary P+ or N+ doping concentration.

Although FIG. 1 illustrates the substrate 10 as a flat substrate having the photoactive regions 12a, 12b and 12c formed contiguously therein, it is understood by a person skilled in the art that the photoactive regions 12a, 12b and 12c may also be formed topographically within the substrate 10, and the substrate 10 may also have formed therein additional appropriate layers and structures, such as but not limited to channel stop layers and structures, as are needed to adequately isolate the photoactive regions 12a, 12b and 12c within the substrate 10.

Shown also within FIG. 1, and formed upon the substrate 10 including the series of photoactive regions 12a, 12b and 12c, is a blanket dielectric passivation layer 16 which has formed therein over the active region R1 of the substrate 10, and at locations alternating with the series of photo active regions 12a, 12b and 12c a series of patterned conductor layers 14a, 14b, 14c and 14d. Similarly, the blanket dielectric passivation layer 16 has formed therein within the peripheral region R2 of the substrate 10 a bond pad 15. Within the present invention and the preferred embodiment of the present invention, the series of patterned conductor layers 14a, 14b, 14c and 14d, as well as the bond pad 15, may typically and preferably be formed incident to patterning of a single blanket conductor layer, although such is not a requirement within the present invention.

Within the preferred embodiment of the present invention, the series of patterned conductor layers 14a, 14b, 14c and 14d typically serves as a first directional charge collection array (within a bidirectional array which is not otherwise illustrated) within the color filter sensor image array optoelectronic microelectronics fabrication whose schematic cross-sectional diagram is illustrated in FIG. 1. Similarly, within the preferred embodiment of the present invention, the bond pad 15 is one of a series of bond pads which is ultimately connected to various of the series of patterned conductor layers 14a, 14b, 14c or 14d for purposes of extracting and sensing charge therefrom incident to illumination of the series of photoactive regions 12a, 12b and 12c. Finally, within the preferred embodiment of the present invention with respect to the blanket dielectric passivation layer 16, the blanket dielectric passivation layer 16 serves to separate the patterned conductor layers 14a, 14b, 14c and 14d, and the bond pad 15, from each other and from the substrate 10.

Within the preferred embodiment of the present invention, the bond pad 15, and typically and preferably also the patterned conductor layers 14a, 14b, 14c and 14d are each formed of an aluminum or aluminum alloy (having an aluminum content of greater than about 90 weight percent aluminum) conductor material. Typically and preferably each of the patterned conductor layers 14a, 14b, 14c and 14d and the bond pad 15 is formed to a thickness of from about 5000 to about 9000 angstroms. Typically and preferably, each of the patterned conductor layers 14a, 14b, 14c and 14d has a minimum linewidth of from about 0.30 to about 2 microns while the bond pad 15 has a bidirectional linewidth (i.e., defining a plan view area) of from about 50 to about 100 microns.

Within the preferred embodiment of the present invention with respect to the blanket dielectric passivation layer 16, the blanket dielectric passivation layer 16 is typically and preferably formed of a dielectric passivation material which is transparent to incident electromagnetic radiation whose detection and classification the color filter sensor image array optoelectronic microelectronic fabrication whose schematic cross-sectional diagram is illustrated in FIG. 1 is designed to detect and classify. Typically and preferably, the blanket dielectric passivation layer 16 is formed of a passivation material selected from the group including but not limited to silicon oxide passivation materials, silicon nitride passivation materials, silicon oxynitride passivation materials and composites thereof, having incorporated therein the series of patterned conductor layers 14a, 14b, 14c and 14d, and the bond pad 15.

Figure 2:
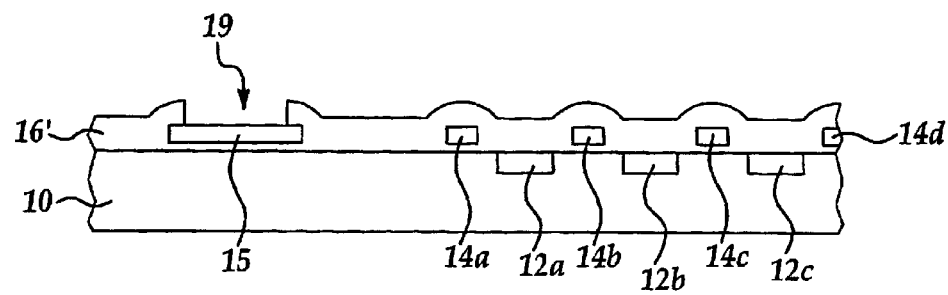

Referring now to FIG. 2, there is shown a schematic cross-sectional diagram illustrating the results of further processing of the color filter sensor image array optoelectronic microelectronic fabrication whose schematic cross-sectional diagram is illustrated is FIG. 1.

Shown in FIG. 2 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 1, but wherein the blanket dielectric passivation layer 16 has been etched to form an etched blanket dielectric passivation layer 16' having formed therein an aperture 19 which leaves exposed a portion of the bond pad 15.

Within the preferred embodiment of the present invention, the blanket dielectric passivation layer 16 as illustrated within the schematic cross-sectional diagram of FIG. 1 may be etched to form the etched blanket dielectric passivation layer 16' as illustrated within the schematic cross-sectional diagram of FIG. 2 while employing photolithographic and etch methods as are otherwise generally conventional in the art of microelectronic fabrication. Typically and preferably, such etch methods provide the aperture 19 of bidirectional linewidth which leaves covered a series of edges of the bond pad 15.

Figure 3:
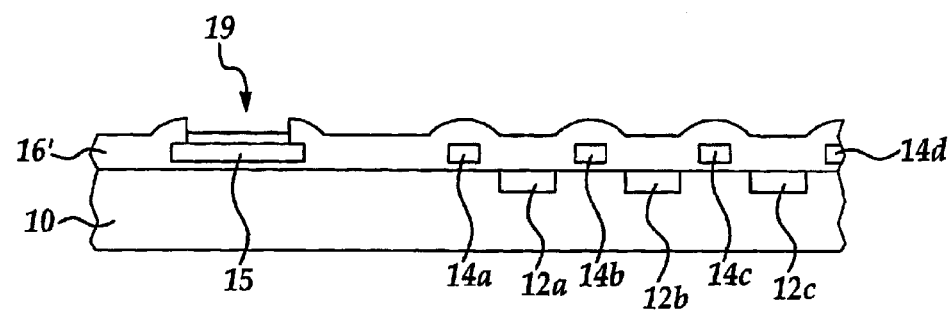

Referring now to FIG. 3, there is shown a schematic cross-sectional diagram illustrating the results of further processing of the color filter sensor image array optoelectronic microelectronic fabrication whose schematic cross-sectional diagram is illustrated in FIG. 2.

Shown in FIG. 3 is a schematic cross-sectional diagram of a color filter sensor image array optoelectrtonic microelectronic fabrication otherwise equivalent to the color filter sensor image array optoelectronic microelectronic fabrication whose schematic cross-sectional diagram is illustrated in FIG. 2, but wherein there has been formed upon exposed portions of the bond pad 15 within the aperture 19 defined by the etched blanket passivation dielectric layer 16' a conductor passivation layer 17.

Within the preferred embodiment of the present invention, the conductor passivation layer 17 is formed of a noble metal conductor passivation material selected from the group consisting of gold, gold alloys, palladium, palladium alloys, platinum, platinum alloys (the alloys having a base noble metal content of at least about 90 weight percent and more typically and preferably from about 90 to about 95 weight percent). Within the present invention and the preferred embodiment of the present invention, gold and gold alloys are particularly preferred for forming the conductor passivation layer 17. Typically and preferably, the conductor passivation layer 17 is formed to a thickness of from about 9000 to about 12000 angstroms, while employing, if feasible, an electroless plating method as is otherwise generally conventional in the art of microelectronic fabrication. As is illustrated within FIG. 3, the conductor passivation layer 17 is formed aligned upon the bond pad 15 and contained within the linewidth of the bond pad 15.

As is understood by a person skilled in the art, within the present invention and the preferred embodiment of the present invention, the conductor passivation layer 17 formed of the noble metal conductor passivation material is formed directly upon exposed portions of the bond pad 15 formed of the aluminum or aluminum alloy conductor material, absent intervening therebetween any additional barrier layers or other metal layers. In particular there is absent barrier layers formed of titanium, tantalum, tungsten and nitrides thereof. There is also absent other metal layers, such as in particular nickel layers.

Figure 4:
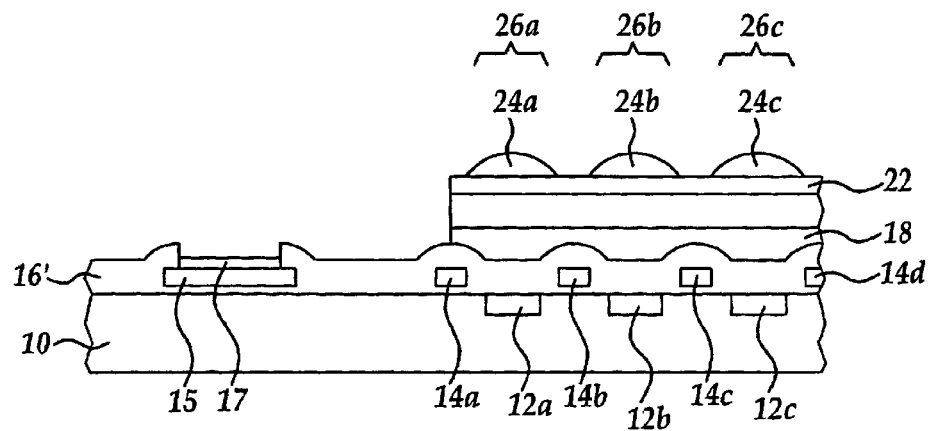

Referring now to FIG. 4, there is shown a schematic cross-sectional diagram illustrating the results of further processing of the color filter sensor image array optoelectronic microelectronic fabrication whose schematic cross-sectional diagram is illustrated is FIG. 3.

Shown in FIG. 4 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 3, but wherein there is formed upon a portion of the etched blanket dielectric passivation layer 16' over the active region R1 or the substrate 10 but not the peripheral region R2 of the substrate 10, a series of layers comprising: (1) a planarizing layer 18 formed upon the etched blanket dielectric passivation layer 16'; (2) a color filter layer 20 formed upon the planarizing layer 18; (3) a spacer layer 22 formed upon the color filter layer 20; and (4) a series of microlens layers 24a, 24b and 24c formed upon the spacer layer 22 and registered with the individual photoactive regions 12a, 12b and 12c within the active region R1 of the substrate 10.

Within the preferred embodiment of the present invention, each of the foregoing layers may be formed employing methods and materials as are conventional in the art of color filter sensor image array optoelectronic microelectronic fabrication.

For example, typically and preferably, the blanket planarizing layer 18 is formed of a planarizing material which, similarly with the blanket passivation layer 16, is transparent to a spectrum of electromagnetic radiation whose detection and classification is effected while employing the color filter sensor image array optoelectronic microelectronic fabrication whose schematic cross-sectional diagram is illustrated in FIG. 1. Such planarizing materials may include, but are not limited to spin-on-glass glass (SOG) planarizing materials and spin-on-polymer (SOP) planarizing materials, such as but not limited to photoresist spin-on-polymer (SOP) planarizing materials.

Similarly, and although not specifically illustrated within the schematic cross-sectional diagram of FIG. 1, the color filter layer 20 typically and preferably has several patterned color layers incorporated therein, as is conventional in the art of color filter sensor image array optoelectronic microelectronic fabrication. Typically and preferably, the color filter layer 20 is formed while employing an organic polymer binder material having incorporated therein separate sections of color filter materials which encompass either the three primary colors of red, blue and green or the three complementary primary colors of cyan, magenta and yellow.

Yet similarly, typically and preferably, the spacer layer 22 is preferably formed of a material which is intended to separate the series of patterned microlens 24a, 24b and 24c from the color filter layer 20. Similarly with the blanket dielectric passivation layer 16 and the planarizing layer 18, the spacer layer 22 is preferably formed of a spacer material which is transparent to a spectrum of incident electromagnetic radiation whose detection and classification is effected by the color filter sensor image array optoelectronic microelectronic fabrication whose schematic cross-sectional diagram is illustrated in FIG. 1. Also similarly with the blanket dielectric passivation layer 16, the blanket spacer layer 22 is also preferably formed from a spacer material selected from the group including but not limited to silicon oxide materials, silicon nitride materials, silicon oxynitride materials, as well as photoresist spin-on-polymer (SOP) materials, and composites thereof.

Finally, with respect to the series of patterned microlens layers 24a, 24b and 24c, the series of patterned microlens layers 24a, 24b and 24c is formed of a patterned photoresist material of appropriate optical properties, where the patterned photoresist layer is thermally reflowed to form the series of patterned microlens layers 24a, 24b and 24c of convex shape, as illustrated within the schematic cross-sectional diagram of the color filter sensor image array optoelectronic microelectronic fabrication whose schematic cross-sectional diagram is illustrated in FIG. 4. For the preferred embodiment of the present invention, the series of patterned photoresist layers from which is formed the series of patterned microlens layers 24a, 24b and 24c is preferably formed of a positive photoresist material, although negative photoresist materials and non-photoresist materials may also be employed, presuming appropriate optical properties and thermal reflow characteristics. Typically and preferably, the patterned positive photoresist layers from which are formed the patterned microlens layers 24a, 24b and 24c are formed as cylindrical patterned positive photoresist layers of diameter from about 5 to about 12 microns and thickness from about 15000 to about 30000 angstroms.

Although not specifically illustrated within the schematic cross-sectional diagram of FIG. 4, each of the patterned microlens layers 24a, 24b and 24c focuses incident electromagnetic radiation upon a corresponding one of the photoactive regions 12a, 12b and 12c. In so doing, it is typically desirable to control both the thicknesses and indicies of refraction of each of the blanket passivation layer 16, the planarizing layer 18, the color filter layer 20, the spacer layer 22 and the patterned microlens layers 24a, 24b and 24c so that incident electromagnetic radiation is optimally focused upon each of the photoactive regions 12a, 12b and 12c. Thus, most optimally within the preferred embodiment of the present invention: (1) the blanket passivation layer 16 is formed of a silicon nitride material of index of refraction of about 1.4 to about 1.6 and thickness about 16000 to about 22000 angstroms upon the substrate 10; (2) the planarizing layer 18 is formed of a negative photoresist material of index of refraction about 1.4 to about 1.6 and thickness about 20000 to about 30000 angstroms upon the blanket passivation layer 16; (3) the color filter layer 20 is formed of an organic polymer binder material of thickness about 10000 to about 20000 angstroms upon the blanket planarizing layer 18; (4) the spacer layer 22 is formed of a negative photoresist material of index of refraction about 1.4 to about 1.6 and thickness about 20000 to about 30000 angstroms formed upon the blanket color filter layer 20; and (5) the patterned microlens layers 24a, 24b and 24c, in addition to the above parameters, are formed with an index of refraction of from about 1.5 to about 1.7 upon the spacer layer 22.

As is illustrated within the schematic cross-sectional diagram of FIG. 1, each portion of the color filter sensor image array optoelectronic microelectronic fabrication whose schematic cross-sectional diagram is illustrated in FIG. 1 which includes a patterned microlens layer 24a, 24b or 24c, in conjunction with a corresponding photoactive region 12a, 12b and 12c of the substrate 10 comprises a pixel element 26a, 26b or 26c.

Figure 5:
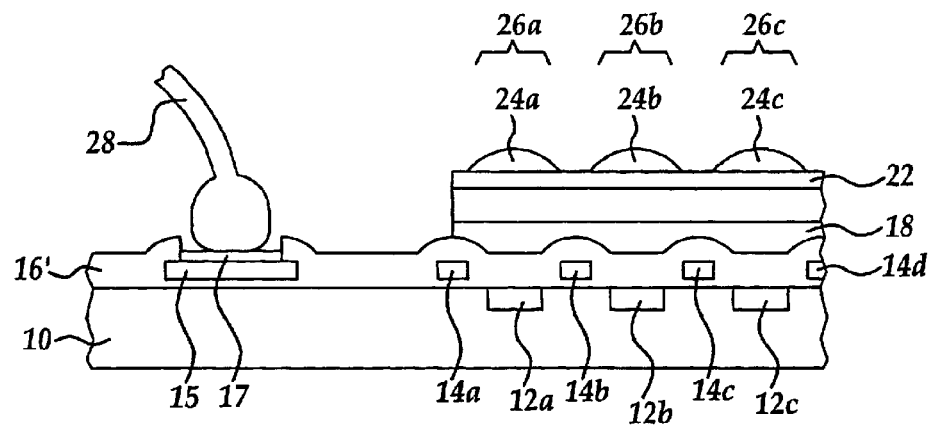

Referring now to FIG. 5, there is shown a schematic cross-sectional diagram illustrating the results of further processing of the color filter sensor image array optoelectronic microelectronic fabrication whose schematic cross-sectional diagram is illustrated in FIG. 4.

Shown in FIG. 5 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 4, but wherein there is bonded upon the bond pad 15 having formed thereupon the conductor passivation layer 17 a bond wire 28.

Within the preferred embodiment of the present invention with respect to the bond wire 28, the bond wire 28 is typically and preferably formed of a gold or gold alloy bond wire material, as is otherwise generally conventional in the art of microelectronic fabrication.

As is understood by a person skilled in the art, the preferred embodiment of the present invention provides particular value for forming the color filter sensor image array optoelectronic microelectronic fabrication whose schematic cross-sectional diagram is illustrated in FIG. 5 with attenuated corrosion of the bond pad 15 incident to having formed thereupon the conductor passivation layer 17 insofar as when forming the color filter sensor image array optoelectronic microelectronic fabrication whose schematic cross-sectional diagram is illustrated in FIG. 5 the bond pad 15, absent having formed thereupon the conductor passivation layer 17, would otherwise repetitively be exposed to the several developers and strippers as are employed for forming the planarizing layer 18, the color filter layer 20, the spacer layer 22 and the series of microlens layers 24a, 24b and 24c as illustrated within the schematic cross-sectional diagram of FIG. 5.

Thus, upon forming the color filter sensor image array optoelectronic microelectronic fabrication whose schematic cross-sectional diagram is illustrated in FIG. 5, there is formed within the context of the present invention a color filter sensor image array optoelectronic microelectronic fabrication with attenuated corrosion of a bond pad within the color filter sensor image array optoelectronic microelectronic fabrication. The preferred embodiment of the present invention realizes the foregoing object by forming upon a bond pad formed of an aluminum or aluminum containing conductor material a conductor passivation layer formed of a noble metal conductor passivation material, preferably a gold or gold alloy conductor material.

As is understood by a person skilled in the art, the preferred embodiment of the present invention is illustrative of the present invention rather than limiting of the present invention. Revisions and modifications may be made to methods, materials, structures and dimensions which are employed to form a color filter sensor image array optoelectronic microelectronic fabrication in accord with the preferred embodiment of the present invention while still forming a microelectronic fabrication, or in particular an optoelectronic microelectronic fabrication, in accord with the present invention, further in accord with the appended claims.

What is claimed is:

1. A microelectronic fabrication comprising:
   a substrate;
   a bond pad formed over the substrate, the bond pad being formed of a conductor material selected from the group consisting of aluminum and aluminum alloy conductor materials;
   a conductor passivation layer formed upon the bond pad, the conductor passivation layer formed of a noble metal conductor material.

2. The microelectronic fabrication claim 1 wherein the noble metal conductor material is selected from the group consisting of gold, gold alloy, palladium, palladium alloy, platinum, platinum alloy conductor materials.

3. The microelectronic fabrication of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The microelectronic fabrication of claim 1 wherein the conductor passivation layer is formed directly upon the bond pad absent an additional barrier layer or conductor layer formed interposed between the bond pad and the conductor passivation layer.

5. The microelectronic fabrication of claim 1 wherein the conductor passivation layer is contained within the linewidth of the bond pad.

6. An optoelectronic microelectronic fabrication comprising:
   a substrate employed within an optoelectronic microelectronic fabrication;
   a bond pad formed over the substrate, the bond pad being formed of a conductor material selected from the group consisting of aluminum and aluminum alloy conductor materials;
   a conductor passivation layer formed upon the bond pad, the conductor passivation layer formed of a noble metal conductor material.

7. The optoelectronic microelectronic fabrication of claim 6 wherein the noble metal conductor material is selected from the group consisting or gold, gold alloy, palladium, palladium alloy, platinum, platinum alloy conductor materials.

8. The optoelectronic microelectronic fabrication of claim 6 wherein optoelectronic microelectronic fabrication is selected from the group consisting of sensor image array optoelectronic microelectronic fabrications and display image array optoelectronic microelectronic fabrications.

9. The optoelectronic microelectronic fabrication of claim 6 wherein the conductor passivation layer is formed directly upon the bond pad absent an additional barrier layer or conductor layer formed interposed between the bond pad and the conductor passivation layer.

10. The optoelectronic microelectronic fabrication of claim 6 wherein the conductor passivation layer is contained within the linewidth of the bond pad.

* * * * *